United States Patent [19]

Eguchi et al.

[11] Patent Number: 5,164,363

[45] Date of Patent: Nov. 17, 1992

[54] METHOD FOR VAPOR-PHASE GROWTH OF A SUPERCONDUCTING OXIDE THIN FILM

[75] Inventors: Kazuhiro Eguchi, Yokohama; Takatosi Nakanisi, Hachioji; Rie Satoh, Yokohama, all of Japan

[73] Assignee: Kabushiki Kaisha Toshiba, Kawasaki, Japan

[21] Appl. No.: 701,587

[22] Filed: May 15, 1991

Related U.S. Application Data

[63] Continuation of Ser. No. 452,605, Dec. 19, 1989, abandoned.

[30] Foreign Application Priority Data

Feb. 10, 1989 [JP] Japan .................................. 1-31328
Feb. 10, 1989 [JP] Japan .................................. 1-31329

[51] Int. Cl.$^5$ .......................... B05D 5/12; C23C 16/00
[52] U.S. Cl. ........................................ 505/1; 505/734; 505/730; 427/62; 427/255.3; 427/255.2; 427/255.1; 427/126.3; 427/585
[58] Field of Search .................. 505/1, 734, 730; 427/62, 63, 255.3, 255.2, 255.1, 248.1, 126.3, 45.1

[56] References Cited

U.S. PATENT DOCUMENTS

| | | | |
|---|---|---|---|
| 4,761,269 | 8/1988 | Conger et al. | 422/245 |
| 4,771,015 | 9/1988 | Kanai et al. | 437/109 |
| 4,950,642 | 8/1990 | Okamoto et al. | 505/1 |

FOREIGN PATENT DOCUMENTS

63-292524 11/1988 Japan .
63-307275 12/1988 Japan .
2162862 2/1986 United Kingdom .

OTHER PUBLICATIONS

Abe et al, "$Y_1Ba_2Cu_3O_{7-\delta}$ Film Formation by an OM-CVD Method," Jpn. J. Appl. Phys. vol. 27(8) Aug. 1988 L1473-1475.

Kwo et al, "In situ epitaxial growth of $Y_1Ba_2C_3O_{7-x}$ films by molecular beam epitaxy with an activated oxygen source" Appl. Phys. lett. 53(26) Dec. 1988 pp. 2683-2685.

Tsuroka et al, "Y-Ba-Cu-O film growth by OMCVD using $N_2O$" Jpn. J. Appl. Phys. 28(10) Oct. 1989 L1800-1802.

Formation of HIgh $T_c$ Superconducting Films by Organometallic Chemical Vapor Deposition-Appl. Phys. Lett. 52 (20), May 16, 1988/A. D. Berry, et al.

Applied Physics Letters, vol. 53, No. 18, Oct. 31, 1988, pp. 1756-1758, American Institute of Physics, New York, US.

A. J. Panson et al: "Chemical vapor deposition of $YBa_2CU_3O_7$ using metalorganic chelate precursors".

Applied Physics Letters, vol. 52, No. 2, May 16, 1988, pp. 1743-1745, New York, U.S.; A. D. Berry et al: "Formation of high $T_c$ superconducting films by organometallic chemical vapor deposition".

*Primary Examiner*—Shrive Beck
*Assistant Examiner*—Roy V. King
*Attorney, Agent, or Firm*—Oblon, Spivak, McClelland, Maier & Neustadt

[57] ABSTRACT

A substrate to be deposited with a superconducting oxide thin film thereon is set a reaction furnace. An organic metal source gas and oxygen-containing gas are alternately introduced into the reactor to pyrolyze, thereby depositing the superconducting oxide thin film containing metal elements of the organic metal at which time an inert gas is used as a carrier gas for the carrier gas.

12 Claims, 4 Drawing Sheets

METHOD FOR VAPOR-PHASE GROWTH OF A SUPERCONDUCTING OXIDE THIN FILM

This application is a continuation of application Ser. No. 07/452,605, filed on Dec. 19, 1989, now abandoned.

BACKGROUND OF THE INVENTION

1. Field of the Invention

The present invention relates to method and apparatus for forming an oxide thin film on a substrate by a metalorganic chemical vapor deposition (MOCVD) method.

2. Description of the Related Art

Recently, oxide superconductors have been discovered, such as $YBa_2Cu_3O_7-\delta$ and $Bi_2Sr_2CaCu_2O_8$, to which attention has been paid in this field of art.

The conventional superconductors are an alloy, or intermetallic compound, such as an Nb-Ti system and $Nb_3Ge$. The critical temperature (Tc) which is an indicator for the characteristic of the superconductors is 20 K. at least. For this reason, the superconductive characteristic is manifested only under a cooling condition using a very expensive liquid helium (4.2 K.) and the superconductors finds very limited applications.

On the other hand, some of the aforementioned oxide superconductors reveals the critical temperature of 100 K. and the characteristic of the superconductors is manifested under a cooling condition using liquid nitrogen (77 K.) which is industrially manufactured at low costs. It has been highly expected that the oxide superconductors find not only the conventional application but also new applications to, for example, electron devices such as ultra-high speed logic elements operating at 77 K.

In order for the oxide superconductors to be used for the industrial purposes, it is necessary that a defect-free oxide crystal can be reproducibly prepared whose composition is well-controlled. The oxide superconductor, if being applied particularly to the electronic devices such as the ultra-high speed logic elements, is required to provide a flat oxide thin film surface of a single crystal.

For the formation of a thin film of the oxide superconductor in the conventional technique, the physical vapor deposition (PVD) techniques have been used such as sputtering and electron beam evaporation. In accordance with these methods, the thin film can be formed on a substrate by an apparatus of a relatively simple design, but it is difficult to precisely control an amount of supply of every element independently, of which the oxide superconductor thin film is composed. Furthermore, since the amount of the aforementioned elements supplied is governed by the configuration of a sputtering target or an evaporation source, it is difficult to deposit an oxide superconductor of a desired composition, as a thin film, on the substrate reproducibly.

Appl. Phys. Lett. 52, 1743 (1988) and Japanese Patent Disclosure (KOKAI) 63-292524 disclose the technique for preparing an oxide superconductor by the MOCVD (metalorganic CVD), one of the CVD techniques, which utilizes the pyrolitic reaction of organic metal.

The MOCVD method is a chemical vapor deposition method as opposed to the aforementioned physical method and can precisely control a feed amount of every element independently of which an oxide superconductor is composed. It is, therefore, possible to provide enhanced control with which the oxide superconductor is formed as a thin film of a desired composition on a substrate.

However, this type of method has a problem as will be set forth below. That is, it has been reported that a thin film as deposited by the conventional MOCVD was composed of a polycrystalline or an amorphous phase, as opposed to the superconductive phase, for a growth temperature of 600° C. or below to provide no superconductive characteristic and that the superconductive characteristic is revealed only after a deposited film was annealed at as high as about 800° C. in air or in a pure oxygen atmosphere (Appl. Phys. Lett. 53, 1756 (1988).

Even if, however, such a thin film is obtained in the aforementioned steps, it is polycrystalline as deposited and the steps thus involved include a step for forming a superconductive phase of a different composition from that of the thin film deposited. In this case, the thin film obtained is very bad in surface flatness, failing to be used for the ultra-high speed electron devices as already set forth above.

If, in order to avoid such problem, the oxidation step and heat treatment step for recrystallization are omitted subsequent to forming a thin film, then no desired superconductive phase can be obtained unless the deposition temperature reaches at least 800° C. or more. Even in this case, no better flat thin film surface is obtained.

The fact that the deposition temperature and the temperature of subsequent annealing are high will lead to a degraded film quality which results from the reaction of the thin film with the substrate.

That is, in accordance with the conventional MOCVD method, no desired superconductive phase can be obtained unless a high-temperature annealing is conducted in air, or in an $O_2$ atmosphere, subsequent to forming the thin film. The omission of the high-temperature annealing requires a rise in the deposition temperature. These indicate that no adequate oxidation of the thin film progresses at lower temperature. It is, therefore, not possible to obtain the crystal phase of a desired superconductor at lower temperature unless the extent of oxidation is increased by some method or the other.

For the deposition of the oxide superconductor in the form of a thin film by the conventional MOCVD method, a mixed organic metal feed gas, together with an oxygen gas, is introduced into a reactor. In accordance with this method, if more oxygen is supplied into the reactor, some of it reacts with the organic metal vapor phase and is consumed in the formation of a compound other than a desired deposition film. For this reason, it becomes difficult to adequately supply oxygen on the surface of the thin film deposited. When such a deposition is carried out at lower temperature, the aforementioned tendency is liable to be more prominent.

In the case where the oxide superconductor is deposited in the form of a thin film with the use of the MOCVD method, it is necessary to heat a source container above room temperature because the vapor pressure of the organic metal as source is generally low. If the source container is heated as set forth above, the source is deposited on the inner wall of a piping extending from the source-container toward the reactor in the case where the piping is placed under room temperature condition. This causes that the source is supplied onto the substrate in the reactors, and that the passage of the piping is stopped up.

To solve these problem, a tape heater has primarily been wrapped around the feedstock containers and piping so that they are heated. It is, however, difficult to uniformly heat the whole piping system because valves, flow controllers, joints, etc. are intricately arranged in the course of the piping system. It is also difficult to heat a jointed portion of the pipe and a feed gas inlet of the reactor, by means of the tape heater, at the same temperature as that of the pipe. Some spot of the piping is not heated, causing the source to be deposited there. This problem remains to be solved.

For a plurality of source containers each containing a different organic metal, it is the usual practices to heat all these feedstock containers by the same heating source. Since, in this case, an optimum temperature for a requisite amount of respect source varies due to, for example, the difference of vapor pressure among the organic metal source, it has been difficult to control all the organic metal source at the optimum temperature. Furthermore, it has been impossible to control the supply of all the source gases at the same temperature as that of the source containers.

SUMMARY OF THE INVENTION

A first object of the present invention is to provide a method for vapor-phase growing an oxide thin film of better surface flatness at a low temperature to enable it to be properly applied to an ultra-high speed electronic device and so on.

A second object of the present invention is to provide an apparatus for vapor-phase growing an oxide thin film by supplying an organic metal source gas of low vapor pressure from source containers into a reactor reproducibly.

A third object of the present invention is to provide an apparatus for vapor-phase growing an oxide thin film by supplying a plurality of kinds of source gas of suitable flow rate from a plurality of source containers into a reactor.

According to an aspect of the present invention there is provided a method comprising the steps of supplying an organic metal source gas containing metal elements for an oxide thin film and an oxygen-containing gas having oxidizability into a reactor accommodating a substrate, and causing the gases to pyrolyze thereby depositing a thin film on the substrate, wherein the source gas and oxygen-containing gas are selectively fed into the reactor during deposition the thin film. It is preferable that, in particular, these gases be fed alternatively.

According to another aspect of the present invention, during the practice of the aforementioned method, the oxygen-containing gas is activated at a different portion from the reactor, thereafter the oxygen-containing gas is introduced into the reactor.

In accordance with the method an oxide thin film is grown on a substrate in an environment under which a thin film growth surface is adequately exposed to oxygen and the oxygen-containing gas is initially activated. By so doing, it is possible to adequately oxidize a growing thin film surface and hence to obtain an oxide thin film at a lower temperature than according to the conventional method. Since the present invention permits the use of the lower growth temperature and needs no annealing at higher temperature, it is possible to improve the surface flatness with which the thin film is grown on a substrate. Therefor it is possible to manufacture an ultra-high speed electronic device.

According to still another aspect of the present invention, there is provided an apparatus comprising a reactor for accommodating a substrate to be treated therein, source container for supplying an organic metal source gas into the reactor, heating means for heating the source container, connecting means for connecting between the source container and the reactor, and a heating container for accommodating and heating a whole or a major section of the connecting means.

According to still another aspect of the present invention, there is provided an apparatus comprising a reactor for accommodating a substrate to be treated therein, a plurality of source containers for supplying a plurality of organic metal source gases into the reactor, heating means for heating the feedstock containers, and control means for individually controlling the heating temperature of the respective source container to a predetermined level.

In the first apparatus, an oxide thin film such as a superconductor thin film can reproducibly be formed by an MOCVD method on a substrate in the reactor with the use of the organic metal source gas of low vapor pressure and can do so without the deposition of the source onto the inner wall of the piping and the clogging of the source on the inner wall of the piping.

In the second apparatus, since the heating temperature of the plurality of feedstock containers can individually controlled, the organic metal source gas of different vapor pressure can reproducibly be evaporated. As a result, the respective source gas can be supplied in an optimal flow rate at an optimal temperature into the reactor.

DETAILED DESCRIPTION OF THE PREFERRED EMBODIMENTS

The present invention will be explained in detail below.

Figure 1:
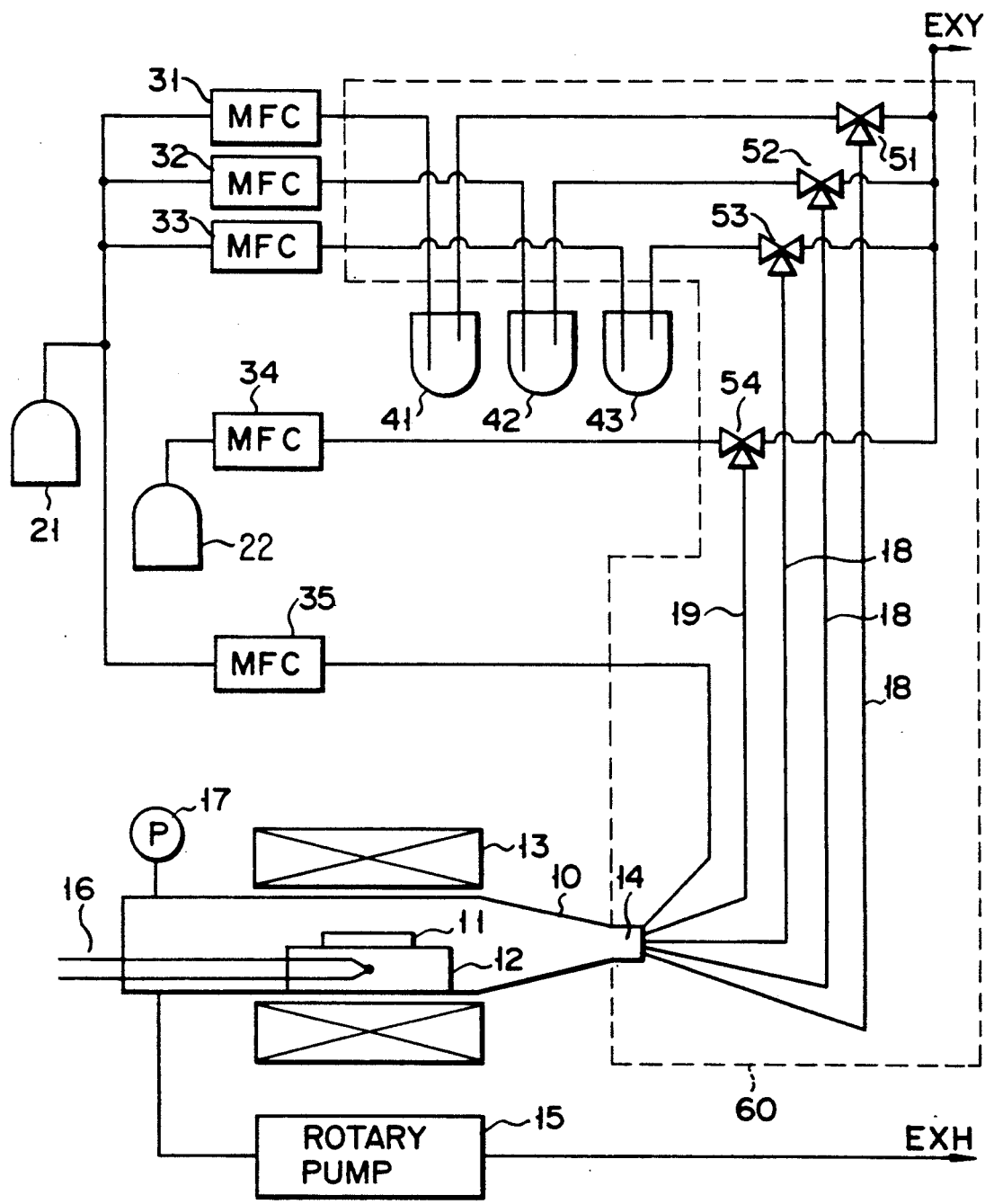
FIG. 1 is a diagrammatic view showing a schematic apparatus according to a first embodiment of the present invention.

FIG. 1 is a diagrammatic view showing an apparatus for performing a first embodiment of the present invention. In FIG. 1, reference numeral 10 denotes a reactor. A susceptor 12 is set within the reactor 10 so as to place a substrate 11 to be treated therein. A heater 13, such as an infrared lamp, is located around the reaction tube 10 to heat the substrate 11 on the susceptor 12. An organic metal source gas and so on, as will be set forth below, is introduced via a gas inlet 14 into the reactor. The source gas in the reactor 10 is emptied by a rotary pump 15. The detection of the temperature of the substrate 11 in the reaction tube 10 is achieved by a temperature sensor 16, such as a thermocouple. The detection of a pressure in the reactor 10 is performed by a pressure sensor 17.

Reference numeral 21 denotes a high-pressure container which is filled with an inert gas, such as an Ar gas. The inert gas coming from the high-pressure container 21 has its feed amount controlled by a flow controller 35, such as a mass flow controller, and is introduced into the reactor 10. The inert gas coming from the high-pressure container 21 is supplied to source containers 41, 42 and 43 via flow controller 31, 32 and 33, respectively. The source containers 41, 42 and 43 contain organic metal containing elements of which an oxide superconductor is composed. If, for example, a $YBa_2Cu_3O_7-\delta$ thin film is to be formed on a substrate, organic metals containing respectively yttrium (Y), barium (B) and copper (Cu) are held in the source containers 41, 42 and 43, respectively. As such organic metals, use is made of, for example, $Y(O_2C_{11}H_{19})_3$ (or $Y(DPM)_3$), $Ba(O_2C_{11}H_{19})_2$ (or $Ba(DPM)_2$), and $Cu(O_2C_{11}H_{19})_2$ (or $Cu(DPM)_2$) where DPM represents $CH_3C(CH_3)_2C(O)CHC(O)C(CH_3)_2CH_3$ When an inert gas is supplied to the source containers 41, 42 and 43, then the organic metal is extracted, as feed gas, out of these containers and admitted into the reactor 10 via three-way valves 51, 52 and 53.

The high-pressure container 22 contains an oxidative type oxygen-containing gas having oxidizability, under a high pressure condition. The oxygen-containing gas is admitted from a container 22 into the reactor 10 via a three-way valve 54 which allows a gas flow to be controlled by a flow controller 34 such as a mass flow controller. As the aforementioned oxygen-containing gas, use may be made of an oxygen gas, an oxidative gas (oxidizing agent) such as an $NO_2$ gas, an $N_2O$ gas and ozone, and a compound gas such as a water vapor.

The respective three-way valves 51 to 54 are of such a type that one way is connected to the reactor side and another way is commonly connected to an exhaust pipe (not shown). Pipes and joints connect between the source containers 41 to 43 on one hand and the flow controllers 31 to 33 and three-way valves 51 to 53 on the other hand, between the flow controller 34 and the three-way valve 54, between the three-way valves 51 to 54 and the gas inlets 14 of the reactor 10 and between the flow controller 35 and the gas inlet 14 of the reactor 10.

The feedstock containers 41, 42 and 43 are warmed to their predetermined temperature by a control system as will be set forth below. The piping are all made of stainless steel and warmed by a heater (not shown) to a temperature of, for example, 260° C. so that any organic metal vapor may not be condensed on the inner wall of the piping. The three-way valves 51 to 54 are of an air-actuated type and all coordinated by a sequence controller. It is, therefore, possible to initially program the ON/OFF timing and holding time of the three-way valves 51 to 54.

The connecting parts comprising pipes 18 from the source containers to the reactor 10, three-way valves 51 to 54 and joints, and pipe 19 from the three-way valve 54 to the reactor 10 are contained within an oven 60 as a heating container. A connecting section between the gas inlet 14 of the reactor 10 and the associated pipe is also contained within the oven 60. The oven 60 is equipped with heaters and fans to allow a hot fluid to be circulated therethrough by means of the fan.

The connecting parts can be heated by the oven 60 to a proper temperature, making it possible to prevent the deposition, clogging, etc. of the source on the inner wall of the piping.

Figure 2:
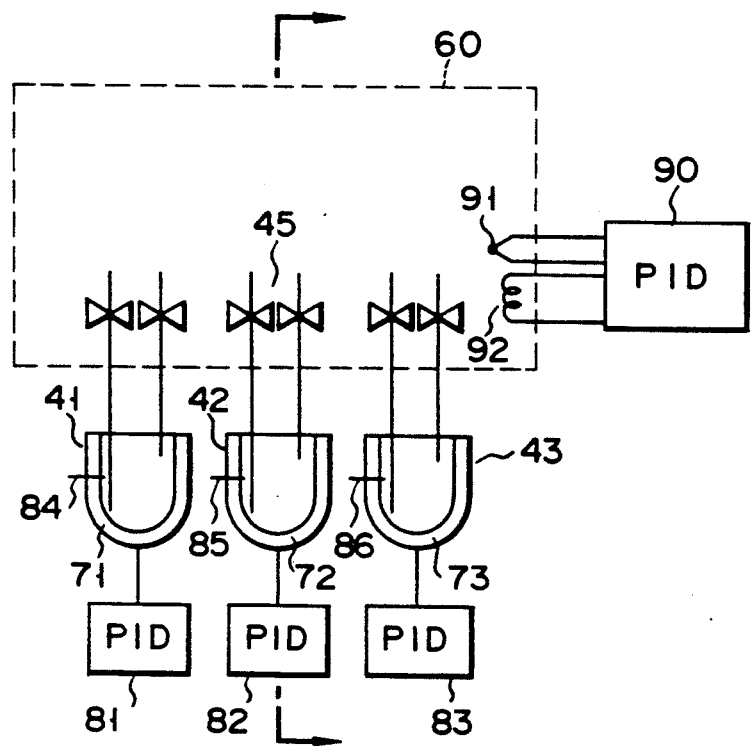
FIG. 2 is a view showing a temperature control system for source containers.

The temperature control system of the source containers 41, 42 and 43 will be explained below with respect to FIG. 2.

Figure 3:
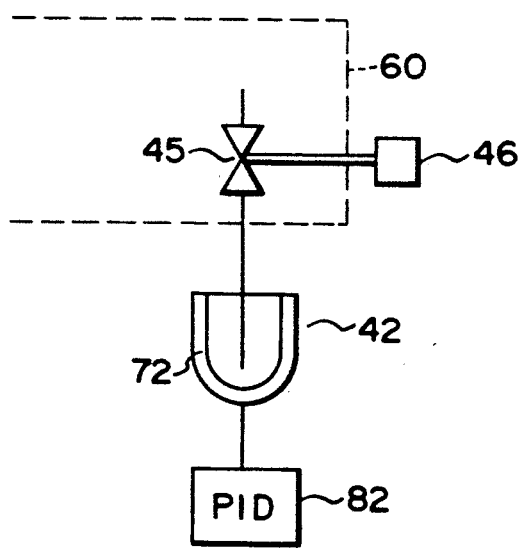
FIG. 3 is a cross-sectional view, as taken along line III—III in FIG. 2.

Mantle heaters 71, 72 and 73 are mounted on the source containers 41, 42 and 43, respectively, and independently temperature-controlled by proportional-plus-integral-plus-derivative-control type temperature controllers (hereinafter referred to as PID's) 81, 82, and 83, respectively. The inlet/output valves 45 of the respective containers 41, 42 and 43 are placed within the oven 60 and a handle 46 of the valve 45 is placed outside the oven 60 as shown in FIG. 3. Temperature sensors 84, 85 and 86 are provided at the feedstock containers 41, 42 and 43, respectively, so as to detect their inner temperature. The detection outputs of the temperature sensors 84, 85 and 86 are PID-controlled to a predetermined value. The respective feed gas can be supplied at an optimum temperature and optimum flow rate to the reaction tube by independently heating the respective source containers and independently controlling their prevalent temperature.

The control of the temperature in the oven 60 can be achieved by controlling the output of the heater 92 by means of the PID 90, in accordance with a detection value of the temperature sensor 91 so as to set the temperature in the oven to a predetermined level.

The operation of the aforementioned apparatus will be explained below in conjunction with forming an oxide thin film on an oxide substrate.

First, a substrate 11 is set on a susceptor 12 and an inert gas is supplied from the high-pressure container 21 into the reactor 10 via the piping system to expel air in the reaction tube 10.

Then the rotary pump 15 is operated and the pressure in the reactor 10 is controlled to a predetermined vacuum level, while looking at a pressure gauge 17. Then the oxygen-containing gas having oxidizability is supplied from the high-pressure container 22 into the reaction tube 10. The susceptor 12 and the substrate 11 thereon are heated by the heater 13 to a predetermined temperature, thus cleaning the surface of the substrate 11. The supply of the oxygen-containing gas is stopped after the cleaning step has been completed. In order to lessen a temporary flow variation resulting from the blocking of the flow passage, the supply of the gas to the reactor is stopped by quickly switching the gas by the three-way valve 54 to the exhaust passage. During the cleaning of the substrate surface, the inert gas is supplied in a predetermined flow rate from the pressure container 21 via the flow controllers 31, 32 and 33 into the source containers 41, 42 and 43. The source gas coming from within the respective container is sent via the piping system to a downstream side. At this time, the three-way valves 51 to 54 are being operated to allow the source gas to be flowed via the exhaust passage. The above is a preparatory step which is carried out prior to starting a vapor phase growth.

The thin-film depositing step is carried out subsequent to the preparatory step.

(a) The three-way valves 51 to 53 are simultaneously switched to the reactor side to deliver the organic metal source gas from the source containers 41 to 43 into the reactor 10. After lapse of a predetermined period of time, the three-way valves 51 to 53 are simultaneously switched to the exhaust passage to exhaust the source gas. That is, the supply of the organic metal source gas to the reactor 10 is stopped.

(b) Soon after the switching of the three-way valves 51 to 53, that is within a time period of, for example, below three seconds, the three-way valve 54 is switched to the reactor side to deliver the aforementioned oxygen-containing gas which has been flown to the exhaust passage to the reaction tube 10. After the oxygen-containing gas has been supplied for a predetermined period of time, the three-way valve 54 is switched to the exhaust side, stopping the supply of the gas into the reactor 10.

The aforementioned steps (a) and (b) are carried out selectively, preferably in an alternate way a predetermined number of times, to deposit an oxide thin film of a predetermined thickness on the substrate.

Since the oxide thin film is formed in this way, a growing thin film surface can adequately be oxidized so that an oxide thin film can be obtained at a lower temperature than on the conventional apparatus. It is thus possible to improve the thin film surface flatness.

The switching timing of the three-way valves may be performed in a different way from that as set forth above. The preparatory step preceding the start of the vapor-phase growth step is performed in the same way as set forth above, followed by the thin film deposition step as will be set forth below in a sequence of (A), (B) and (C):

(A) The three-way valve 51 is switched to the reactor side to deliver the organic metal source in the source container 41 into the reactor 10. After lapse of a predetermined period of time, the three-way valve 51 is also switched to the exhaust side to couple the organic metal source to the exhaust passage for exhaust. The three-way valve 54 is switched to the reactor side, within three seconds after the switching of the three-way valve 51, to supply the oxygen-containing gas being delivered to the exhaust passage into the reactor 10. After the oxygen-containing gas has been supplied in a predetermined flow rate to the reactor 10 for a predetermined period of time, the three-way valve 54 is switched to the exhaust side, stopping the supply of the oxygen-containing gas into the reactor 10.

(B) The source gas in the source container 42 and oxygen-containing gas are supplied to the reactor 10 in the same way as set forth above.

(C) The source gas in the source container 43 and oxygen-containing gas are supplied to the reactor 10 in the same way as set forth above.

These steps (A) to (C) are repetitively performed in the way as set forth above to form a thin film on the substrate 11. Even in this case, the source gas and oxygen-containing gas are supplied to the reaction tube 10 in an alternate way as set forth above.

Figure 4:
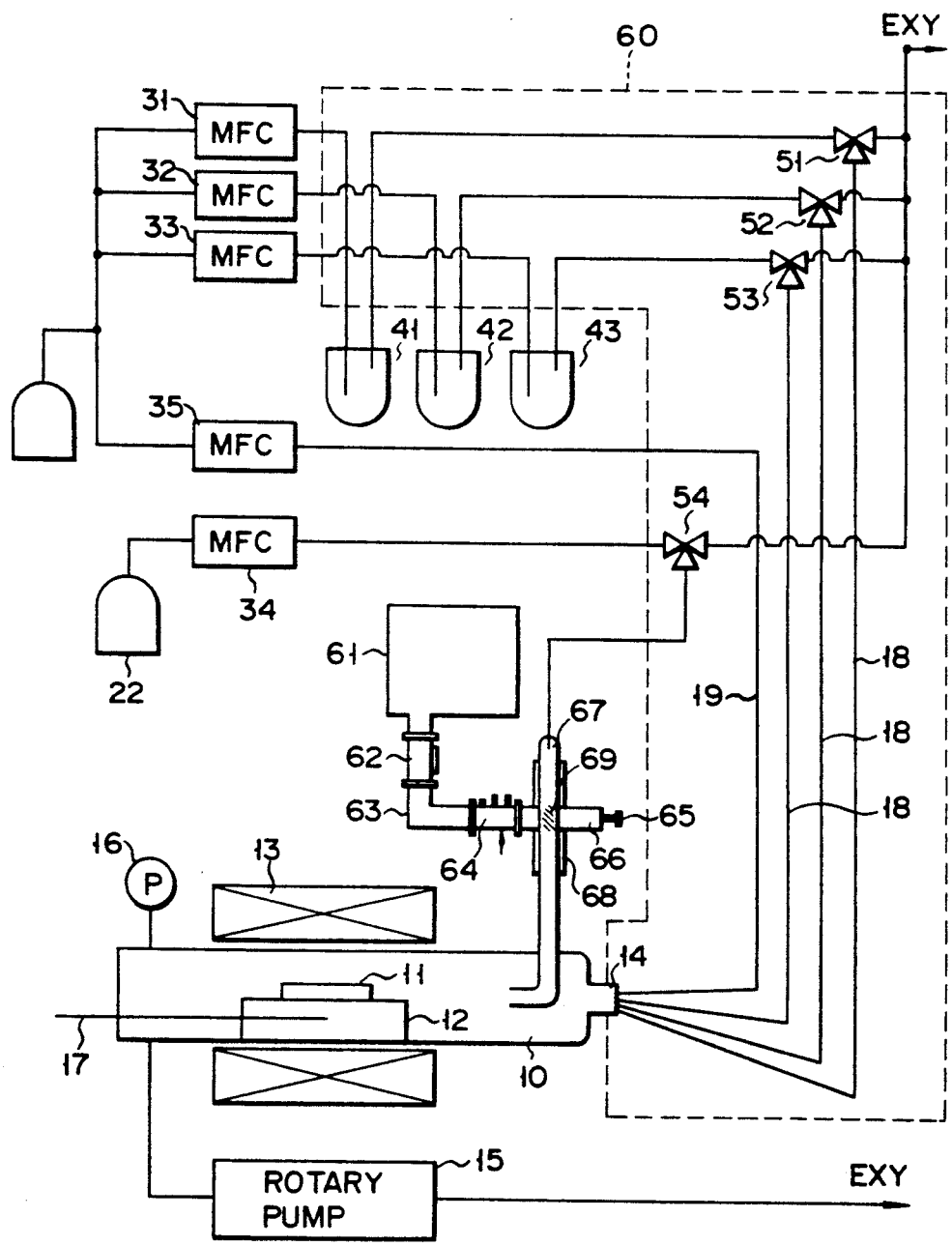
FIG. 4 is a diagrammatic view showing an apparatus according to a second embodiment of the present invention.

The method of the second embodiment of the present invention will be explained below. FIG. 4 is a diagrammatic view showing a vapor-phase growth apparatus according to the second embodiment of the present method. Identical reference numerals are employed in FIG. 4 to designate parts or elements corresponding to those shown in FIG. 1 and any detailed explanation is omitted. The difference of this apparatus from that of FIG. 1 is that a microwave discharge tube is provided on the oxygen gas inlet passage to supply an activated oxygen gas into the reaction tube.

That is, the aforementioned microwave discharge apparatus comprising parts 61 to 68 is provided on the gas passage which is located between a three-way valve 54 and the reactor 10. The oxygen-containing gas is supplied from the three-way valve 54 into a chamber 67 which is located before the reactor. The oxygen-containing gas in the chamber 67 is activated upon the application of a microwave. A $TE_{10}$ wave is supplied from the magnetron oscillator 61 via a dummy load and isolator 62, E corner waveguide 63 and three-stub tuner 64 into an applicator (waveguide) 66 which is equipped with a shorter plunger 65. The waveguide 66 has an aperture at its surface which is situated in a direction of the electric field of the waveguide. The chamber 67 is fitted into the aperture to a full aperture extent. Reference numeral 68 denotes an external leakage preventing plate for microwave. The oxygen-containing gas in the chamber 67 produces a plasma by a microwave in a portion 69, thus activating the oxygen-containing gas.

In order to deposit an oxide thin film by the apparatus, the preparatory step is carried out in the same way as set forth in connection with the first aspect of the present invention. As this stage, the activation of the oxygen gas by the microwave is not carried out.

The thin-film deposition step is conducted, after the preparatory step has been completed, as will be set forth below.

(a) The three-way valves 51 to 53 are simultaneously switched to the reactor side, delivering an organic metal source gas into the reaction tube 10. After lapse of a predetermined period of time, the three-way valves 51 to 53 are simultaneously switched to the exhaust side to allow the source gas to be exhausted to the exhaust passage, stopping the supply of the organic metal source gas to the reactor 10.

(b) The three-way valve 54 is switched to the reactor side within three seconds after the three-way valves 51 to 53 are switched as set forth above. By so doing, the oxygen-containing gas flowing in the exhaust passage is sent into the reaction tube 10 via the chamber 67. In synchronization with the timing with which the oxidative gas is introduced into the chamber 67, a magnetron power source is triggered, causing the gas to be converted into a plasma at the portion 69 under the application of a magnetron wave of a predetermined power output. The activated oxygen is delivered via the chamber 67 into the reactor 10 where the substrate surface is exposed with the oxygen. At this time, the reactor 10, including the chamber 67, is held under a predetermined vacuum level.

After a predetermined flow amount of oxidative gas has been supplied into the reactor under the application of the microwave power, the magnetron power source is turned off and, at the same time, the three-way valve 54 is switched to the exhaust side, thus stopping the supply of the oxidative gas into the reactor 10.

By performing the steps (a) and (b) in a manner to be alternated a predetermined number of times, it is possible to deposit a oxide thin film of a predetermined thickness on the substrate.

With the oxygen-containing gas supplied to the substrate in a manner to be exited to activate, it is possible to promote the oxidation of the thin film and further to improve a thin film surface flatness.

EXAMPLES

Examples of this invention will be explained below.

EXAMPLE 1

This Example represents the first embodiment of the present invention. In the Example, a thin film of $YBa_2$-

$Cu_3O_7$-$\delta$ was deposited on a substrate, as will be set out below, using $Y(DPM)_3$, $Ba(DPM)_2$ and $Cu(DPM)_2$ as source gases. The respective source containers, containing a different feed gas, were held at the temperatures of 140° C., 250° C. and 150° C., respectively.

On the susceptor 12 was placed a strontium titanate ($SrTiO_3$) crystal substrate 11 of (100) crystal surface, and its surface was cleaned by a chemical technique. A high-purity argon gas was delivered from the high pressure container 21 via the corresponding piping into the reactor 10, and the air in the reactor 10 was replaced with the argon gas. Then the rotary pump 15 was operated, so that the pressure in the reactor 10 was adjusted to a range of 5 to 76 Torr. Thereafter, a high-purity $O_2$ gas was supplied from the high-pressure container 22 into the reactor and the susceptor 12 and substrate 11 were heated by the heater 13 to a predetermined temperature of a range 600° to 850° C. and the substrate surface was subjected to a cleaning step. While the surface of the substrate was cleaned, an Ar gas whose flow rate was controlled by the mass flow controller (MFC) was fed, in a flow rate of 50 cm$^3$/min, from the high-pressure container 21 into the respective containers 41 to 43 to obtain an organic metal gas. The organic metal gas thus obtained was sent via the corresponding piping to the downstream side.

Figure 5:
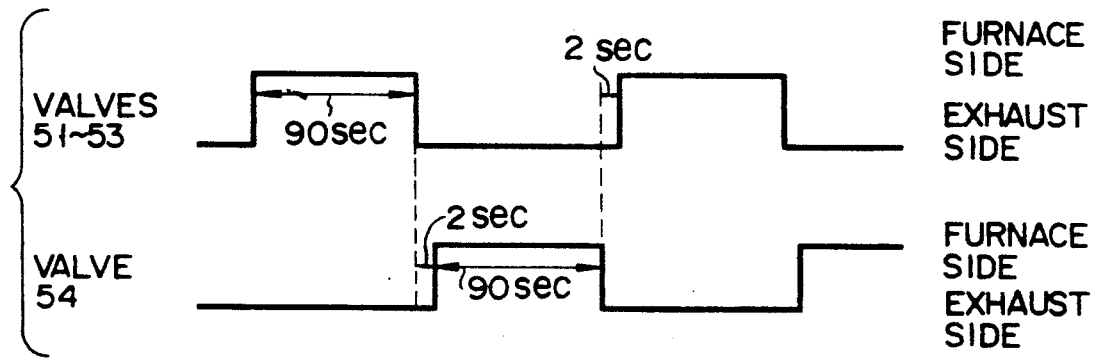
FIG. 5 is a view showing an example of a timing with which a gas is switched to a reactor side or an exhaust side.

After the aforementioned preparatory step, a thin film deposition step was performed as shown in FIG. 5.

(a) With the three-way valves 51 to 53 simultaneously switched to the reactor side, the organic metal gas was delivered for 90 seconds into the reactor 10. Then the three-way valves 51 to 53 were simultaneously switched to the exhaust side, stopping the supply of the organic metal gas into the reactor.

(b) With the three-way valve 54 switched to the reactor side for 2 seconds after the switching of the three-way valves 51 to 53, the $O_2$ gas was sent into the reactor 10. After the $O_2$ gas was supplied in a flow of 300 cm$^3$ for 90 seconds, the three-way valve 54 was switched to the exhaust side, stopping the supply of the $O_2$ gas into the reactor.

By repeating the steps (a) and (b) 20 times, an oxide thin film was deposited on the substrate to a thickness of about 5000 Å.

It has been found that the thin film obtained in this example revealed a surface flatness in the order of 200 Å in surface roughness and that, upon measurement by X-ray diffraction, only a polycrystal of $YBa_2Cu_3O_7$-$\delta$ was observed whose (001) crystal face was parallel to a (001) crystal face of $SrTiO_3$ substrate crystal—c-axis textured—. From this, it has been found that the thin surface thus obtained was epitaxially grown on the crystal substrate. The thin film was measured for its low-temperature electrical resistance and found to exhibit the superconductive characteristic in which case the critical temperature was 72 K.

For comparison, a thin film was deposited on the substrate, using the conventional steps, and examined for its characteristics. In this case, identical deposition conditions were employed except that the organic metal gas and $O_2$ gas were simultaneously delivered into the reactor 10. An about 9000 Å-thick film was deposited on the substrate for 1 hour.

The thin film obtained by the conventional method was of an amorphous type, revealing an electrical insulator in the "as-deposited" state. With a temperature rise up to 800° C., an about 8000 Å-thick thin film was grown on the substrate. Upon measurement by X-ray diffraction, it has been found that the thin film obtained was polycrystalline and contained fine crystals having c-axis-textured and fine crystals having (100) orientation (a-axis-textured) in considerable amounts. It has also been found that the thin film contained unidentifiable compounds except for $YBa_2Cu_3O_7$-$\delta$. The surface and cross-section of the thin film were observed by means of a microscope and found that the grown surface was not flat, that is, had a surface roughness of about 2 μm. The thin film was also measured for its electrical resistance and found that the resistance becomes zero at 40 K. That is, it has been confirmed that the critical temperature of the superconductor is 40 K.

According to this Example, the $YBa_2Cu_3O_7$-$\delta$ thin film obtained upon alternate supply of the organic metal gas and $O_2$ gas was flatter than that obtained by the conventional method. The flattening of the thin film is indispensable to a superconductive junction device and the Example has been proved effective in this respect. From the Example it has been found that the growth temperature of the oxide superconductive thin film can be made about 200° C. lower than that involved in the conventional method. The achievement of the low-temperature thin film growth has been proved effective to reduce the extent to which the thin film deposited is degraded or downgraded in a reaction with the substrate crystals.

Furthermore, upon measurement by X-ray diffraction and measurement for the superconductive critical temperature it has been found that an oxide superconductive thin film obtained in the Example reveals a higher epitaxial growth layer than that obtained in the conventional method and little contains other compounds. It has been proved that it is possible to obtain a higher critical temperature.

EXAMPLE 2

In this Example, a $YBa_2Cu_3O_7$-$\delta$ thin film was deposited in basically the same method as in Example 1, except that a different switching timing was used for the three-way valves in the thin film deposition step.

The preparatory step as set forth in Example 1 was performed in this Example.

Figure 6:
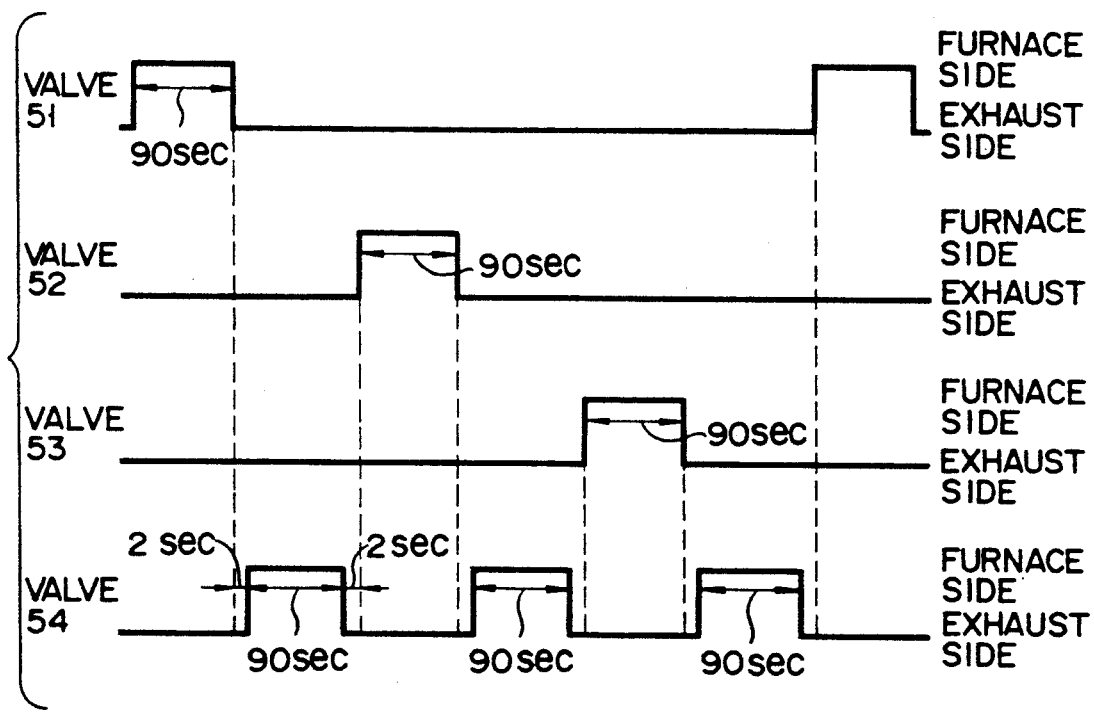
FIG. 6 is a view showing another example of a timing with which a gas is switched to a reactor side or an exhaust side.

In the thin film deposition step, the organic metal gas and $O_2$ gas were supplied into the reactor 10 with the same timing as shown in FIG. 6.

(A) The three-way valve 51 was switched to the reactor side, supply $Y(DPM)_3$ vapor into the reactor 10 for 90 seconds. Thereafter, with the three-way valve 51 switching to the exhaust side, the stream of the vapor was diverted to the exhaust passage. Within 2 seconds after the switching of the three-way valve 51, the three-way valve 54 was switched to the reactor side to allow the $O_2$ gas which was flowed through the exhaust passage to be delivered into the reactor 10. After the delivery of the $O_2$ gas for 90 seconds in a flow of 100 cm$^3$/min., the three-way valve 54 was switched to the exhaust side, stopping the delivery of the $O_2$ gas into the reactor 10.

(B) $Ba(DPM)_2$ vapor and $O_2$ gas were alternately supplied into the reactor 10 in the same way as in (A).

(C) Similarly, $Cu(DPM)_2$ vapor and $O_2$ gas were also alternately supplied into the reactor 10 in the same way as in (A).

By the repetition of the steps (A) to (C), a $YBa_2Cu_3O_7$-$\delta$ was deposited on the substrate crystal. In the film formation, the growth temperature was 600° C., and the organic metal gas and $O_2$ gas were supplied in the same way, in the same flow rate for a same integral supply time period as in Example 1 so as to compare the result with that of Example 1. The supply of the organic metal gas and $O_2$ gas per run was 1000 cm$^3$/min., and the supply time thereof per run was varied 1 minute (total repetition times were 30 times) and 5 minutes (total repetition times were 6 times). An about 8000 Å-thick thin film was grown on the substrate crystal for 3 hours. Furthermore, the growth temperature, that is the substrate temperature, was varied in a range 600° C. to 500° C. to see what effect was exerted over the characteristics of the thin film. The $O_2$ gas supply time was increased over the organic metal gas supply time by 1 to 10 times.

In an oxide thin film deposited on the substrate crystal at 600° C., a temperature equal to that of Example 1, it was found that the thin film had a more complete c-axis textured, a better surface flatness and a higher superconductive critical temperature than those in Example 1. By lowering the growth temperature to 550° C., an almost all c-axis-textured thin film was formed on the substrate crystal. In Example 2, an epitaxial thin film was found to be formed on the substrate crystal at a temperature which was 50° C. lower than that in Example 1. When the $O_2$ gas supply time was 10 times as long as the organic metal gas supply time, the superconductive critical temperature was higher by about 5 to 10 K. than when the $O_2$ gas supply time was the same as the organic metal gas supply time. When the $O_2$ supply time was extended taking into consideration the difficulty with which the metals Cu, Ba and Y are oxidized, it was found that the superconductive critical temperature was improved by several degrees (K).

EXAMPLE 3

Using Bi($C_6H_5$)$_3$, Sr(DPM)$_2$, Ca(DPM)$_2$ and Cu(DPM)$_2$ as the organic metal, a Bi-Sr-Ca-Cu-O-system oxide thin film was grown on the substrate crystal on the same vapor-phase growing apparatus as in Example 1, except that four source containers were provided. With Bi($C_6H_5$)$_3$, Sr(DPM)$_2$, Ca(DPM)$_2$ and Cu(DPM)$_2$ containers set at temperature of 120° C., 230° C., 200° C. and 130° C., respectively, an Ar carrier gas was delivered into each container in a flow rate of 50 cm$^3$/min. The reactor was set at a pressure of 30 Torr.

In the same way as in Example 1, an organic metal-mixed vapor and $O_2$ gas were supplied into the reactor in an alternate way to form an oxide thin film on the substrate. The supply time and interval were the same as in Example 1. The thin film obtained was compared for its characteristics with that obtained by the conventional method for simultaneously supplying the organic metal vapor and $O_2$ gas into the reactor. As a result, it was possible to obtain the same beneficial effect as in Example 1. That is, a Bi-Sr-Ca-Cu-O-system oxide thin film was grown by the conventional method, as a c-axis-textured one, only at a substrate temperature of 800° C., revealing the surface roughness of about 1 μm. In the Example, an almost c-axis-textured epitaxial thin film was obtained at a substrate temperature of 600° C., showing a surface roughness of about 50 Å. That is, a surface flatness was largely improved in comparison with that obtained in the conventional method. Upon measurement for the low-temperature electrical resistance of the thin film obtained it has been found that the thin film exhibits a superconductivity whose superconductive critical temperature Tc is 80 K.

EXAMPLE 4

Using Bi($C_6H_5$)$_3$, Sr(DPM)$_2$, Ca(DPM)$_2$ and Cu(DPM)$_2$ as the organic metal sources, a Bi-Sr-Ca-Cu-O-oxide thin film was grown on the substrate, on the same equipment as Example 3, under the same condition as in Example 2. The Bi-Sr-Ca-Cu-O-oxide thin film was obtained by repetitively alternately supplying an organic metal gas and $O_2$ gas to the reactor, the source gases being supplied in an order of Bi($C_6H_5$)$_3$-$O_2$-Sr(DPM)$_2$-$O_2$-Ca(DPM)$_2$-$O_2$-Cu(DPM)$_2$-$O_2$.

The growth condition was the same in Example 3, except for the supply order of the source gas and $O_2$ gas for growth. An almost completely c-axis-textured Bi-Sr-Ca-Cu-O-oxide thin film was obtained at the growth temperature of 600° C., a temperature which was able to be reduced by 200° C. or more as compared with that of the conventional method. The obtained thin film revealed a surface flatness of about 50 Å, showing a noticeable improvement upon comparison with above 1 μm as achieved by the conventional method. Upon measurement for the low-temperature electric resistance of the thin film obtained, it was found that it showed a superconductive characteristic at the critical temperature of 85 K. Upon increasing the number of repetitions as in Example 2, it was found that it was possible to further reduce the growth temperature of the epitaxial thin film by 50° to 100° C.

EXAMPLE 5

This Example corresponds to the second embodiment of the present invention. In the Example, a YBa$_2$Cu$_3$O$_{7-\delta}$ thin film was vapor-phase grown on the substrate by the apparatus of FIG. 4.

Here the frequency of a microwave used was 2.4 GHz and the waveguide 66 had a hole diameter of 3.8 cm at a face thereof which was provided along in the direction of its electric field.

For the vapor-phase growth, the preparatory step was performed as in Example 1. Then the deposition step wave conducted as will be set forth below:

(a) The three-way valves 51 to 53 were simultaneously switched to the reactor side and an organic metal gas was sent into the reactor 10. After lapse of 90 seconds, the three-way valves 51 to 53 were simultaneously switched to the exhaust side to allow the organic metal gas to be vented.

(b) After lapse of 2 seconds following the switching of the three-way valves 51 to 53, an oxygen gas which was being flowed through the exhaust side was introduced via the chamber 67 into the reactor 10 in which case an oxygen gas was activated by a plasma at the zone 69 in the chamber 67. The activated oxygen gas supplied to a substrate surface in the reactor 10. At this time, the pressure in the reaction tube 10 including the chamber 69 was 5 Torr and the power output of a microwave used as 200 W. Under such condition, the oxygen gas was supplied in a flow rate of 300 cm$^3$/min. for 90 seconds into the reactor with the microwave being applied to the oxygen gas. Then the magnetron power source was cut off and the three-way valve 54 was switched to the exhaust side, stopping the supply of the oxygen gas to the reactor 10.

By performing 20 repetitions of the steps (a) and (b), an about 4000 Å-thick oxide thin film was grown on the substrate. The growth temperature was set at predetermined level of a 450° to 800° C. range. Examination was made for an influence the growth temperature exerted upon the thin film.

For comparison, examination was made for the characteristics of a thin film which was deposited on the substrate by the conventional method. The organic metal gas and oxygen gas were simultaneously supplied into the reactor 10 and an about 1 μm-thick thin film was obtained in 1 hour under the same deposition condition except that no microwave's power output was applied to the oxygen gas and that the integral supply time of the organic metal gas was the same as in Example 1.

A thin film obtained at 600° C. in the Example had a surface flatness of about 50 Å and, upon measurement by X-ray diffraction, was found to be nothing but a YBa$_2$Cu$_3$O$_7$-δ polycrystal with a (001) face thereof arranged parallel to a (001) face of an SrTiO$_3$ substrate crystal, that is, arranged wholly as a single crystal phase having a c-axis textured.

With a decreasing growth temperature, the diffraction peak strength obtained by the X-ray diffraction was lowered little by little in comparison with that of a thin film grown at 600° C. and decreased to about one half that peak strength at the growth temperature of 450° C., revealing a broadening diffraction full width at half maximum (FWHM). The result of the X-ray diffraction showed a disturbance in microcrystals in the deposited thin film and more disturbance with a decreasing temperature.

The superconductive critical temperature was gradually lowered from 80 K. at the growth temperature 600° C. to 50 K. at the growth temperature 500° C. further down to 40 K. at the growth temperature 450° C. The superconductive critical temperature of the thin film as obtained in the lower temperature range was considerably lower than a maximal value 90 K. which was achieved by a bulk crystal. In this Example, since the condition such as a supply amount of O$_2$ gas and power output of the microwave applied, other than the growth temperature are not all optimal, it will be possible to improve the film quality and superconductive critical temperature if the growth condition is made optimal.

On the other hand, a thin film obtained by the conventional method was found to be an electric insulator of an amorphous phase at a growth temperature of below 600° C. The growth temperature was tried to be increased in increments of 50° C from 600° C. up to 800° C. A polycrystalline YBa$_2$Cu$_3$O$_7$-δ thin film was obtained only at the higher growth temperature than 700° C. It was found that the polycrystal thus obtained showed a c-axis-textured but that a considerable amount of a-axis-oriented fine crystals was contained. With a rise in the growth temperature the crystal grain size was increased from 1 μm at 700° C. to over 2 to 3 μm at 800° C. A corresponding surface flatness of the thin film was lowered. The superconductive critical temperature of the thin film was simply 50 K. at the growth temperature of 700° C. and simply 40 K. at the growth temperature of 800° C.

According to the Example, as evident from a comparison with the characteristics of the thin film obtained by the conventional method, a superconductive thin film was obtained at a very low temperature of 400° C., as compared to 700° C. in the conventional case, using the organic metal gas and an oxygen gas activated under the application of a microwave's power output. Unlike the conventional case, it was possible to obtain a single crystal, not a polycrystal. This means that a lowering in the growth temperature of a thin film can reduce the extent to which the thin film is degraded or downgraded through a reaction with the substrate crystal. The fact that the YBa$_2$Cu$_3$O$_7$-δ thin film was deposited at a temperature as low as 450° C. means that a semiconductor silicon (Si) wafer can be used as a substrate crystal which has thus far been impossible to be used through a strongly alloying reaction with the conventional YBa$_2$Cu$_3$O$_7$-δ. This has a greater advantage of paving the way for a composite unit of an oxide superconductor thin film and the semiconductor electronic device in the near future. Furthermore, due to a single crystal film thus obtained, preparation can be made for depositing a better epitaxial insulating thin film of a single crystal free from any disturbance, as a superconductor-insulator junction for a basic superconductive device, on a YBa$_2$Cu$_3$O$_7$-δ thin film-deposited insulator crystal.

EXAMPLE 6

In this Example, the composition and corresponding organic metal source for a thin film were the same as in Example 1 and the apparatus as shown in FIG. 1 was employed in which case an N$_2$O gas was used as an oxygen-containing gas.

The preparatory step preceding a growth step was performed under the same condition as in Example 1 except that the N$_2$O was used in place of O$_2$.

In the step of depositing a thin film, the substrate temperature, pressure in the reactor and a flow rate of N$_2$O gas supplied into the reactor were 600° C., 10 Torr, and 50 cm$^3$/min, respectively. An about 1 μm-thick thin film was obtained for 1 hour. In this Example, an organic metal gas and N$_2$O gas were alternately supplied into the reactor by the switching of the three-way value. The same advantage as set forth above was also gained by the simultaneously supply of the N$_2$O gas and organic metal gas.

It has been found that the thin film obtained in Example 6 exhibits, like that obtained in Example 1, an excellent surface flatness and a c-axis textured. The critical temperature of the thin film was 78 K. It was thus possible to obtain a film of excellent surface flatness at a temperature lower than that in the conventional case.

EXAMPLE 7

In this Example, a Bi-Si-Ca-Cu-O-oxide thin film was grown on the substrate with the use of the same organic metal source as in Example 3. In Example 7, an N$_2$O gas was used in place of an O$_2$ gas and the organic metal gas and N$_2$O gas were alternately supplied into the reactor.

Even in Example 7, it was possible to obtain an oxide superconductor thin film better in surface flatness at a low temperature. The same advantage as in Example 2 was obtained in Example 7. It is also possible to obtain the same advantage as set forth above even if a 1:1 NO$_2$ to O$_2$ mixture was employed as an oxidizing gas.

EXAMPLE 8

In this Example, an added advantage was found to be gained by heating the connection parts for mutual connection of the source container and reactor by means of the oven. Here a YBa$_2$Cu$_3$O$_7$-δ thin film was deposited on a (100) surface of SrTiO$_3$ substrate with the use of Y(DPM)$_3$, Ba(DPM)$_2$ and Cu(DPM)$_2$ as source gas.

The source containers 41, 42 and 43 held the Y(DPM)$_3$, Ba(DPM)$_2$ and Cu(DPM)$_2$, respectively, and was kept at 140° C., 250° C. and 150° C., respectively.

The oven 60 was held at 260° C. In this state, the temperature in the oven 60 was measured and found to be almost uniform, revealing no variation with time.

Helium was employed for an inert gas for use as a carrier gas, 100 to 150 cm$^3$/min of He was flowed through the respective source containers 41, 42 and 43, and the pressure in the reactor 10 was 50 Torr. An O$_2$ gas was supplied as a total flow of about 1 l/min through the reaction tube and a total amount of He supplied was 3 l/min.

Under this condition, a YBaCuO was deposited on the substrate for about 1 hour to obtain a thin film about 2 μm thick. Upon examination by an electronic microscope and measurement by X-ray diffraction it has been found that the thin film surface showed a better surface and an epitaxial YBa$_2$Cu$_3$O$_7$-δ film of a single crystal phase was obtained having a c-axis-textured. Examination was made for the temperature dependency of its resistance and the critical temperature Tc was 84 K. A similar characteristic was also obtained in the case of a (100) surface of MgO substrate. As a result of tests it has been confirmed that it is possible to obtain better reproducibility and controllability.

According to Example 8, it has been confirmed that the connection parts, such as piping, valves and joints, can be uniformly heated in the oven. Furthermore, the organic metal source gas can reproducibly be supplied from the source container to the reaction tube and the thin film was deposited on the substrate with better reproducibility and controllability. This arrangement can hold the temperature in the whole piping system higher than that in the source containers, initially preventing the source gas from being condensed on the inner wall of the piping system and the piping system from being clogged with the deposits.

EXAMPLE 9

By the same method as set forth above, an epitaxial BiSrCaCuO thin film of a single crystal was reproducibly and controllably deposited on a (100) surface of SrTiO$_3$ substrate at which time the critical temperature was 100 K.

The present invention was not restricted to the aforementioned Examples. For example, a thin film may be deposited not only as the YBa$_2$Cu$_3$O$_7$-δ and Bi-Sr-Ca-Cu-O-system ones but also as other oxide superconductors. Of the oxides other than the oxide superconductor, an ordinary oxide including a ferroelectric oxide such as LiNbO$_3$, BaTiO$_3$, PbTiO$_3$ and PbZr$_x$Ti$_{1-x}$O$_3$, oxide semiconductor such as ZnO, and so on, can be used for MOCVD vapor-phase growth.

The apparatus of the present invention can be applied to not only the vapor-phase growth of the oxide but also that of an organic metal source of lower vapor pressure, if necessary, with added advantage.

What is claimed is:

1. A method for vapor-phase growth of a superconducting oxide thin film comprising:
   supplying organic metal source gases containing metal elements for the superconducting oxide thin film and an oxygen-containing gas having oxidizability into a reactor accommodating a substrate; and
   causing the gases to pyrolyze, thereby depositing the superconducting thin film on said substrate;
   wherein said organic metal source gases and said oxygen-containing gas are alternately introduced into the reactor during the deposition of said thin film.

2. The method according to claim 1, wherein said organic metal source gas contains a plurality of organic metal compounds and said organic metal source gas, and said oxygen-containing gas are alternately introduced into said reactor.

3. The method according to claim 1, wherein said organic metal source gas contains a plurality of organic metal compounds, and each of said organic metal compounds and said oxygen-containing gas are alternately introduced into said reactor.

4. The method according to claim 1, wherein said oxygen-containing gas is at least one selected from the group consisting of an O$_2$ gas, ozone, NO$_2$ gas, N$_2$O gas and water vapor.

5. The method according to claim 1, wherein said organic metal gas is carried by an inert gas.

6. The method according to claim 1, wherein said superconducting oxide thin film is YBa$_2$Cu$_3$O$_x$.

7. A method for vapor-phase growth of a superconducting oxide thin film comprising:
   supplying organic metal source gases containing metal elements for the superconducting oxide thin film and an oxygen-containing gas having oxidizability into a reactor accommodating a substrate; and
   causing the gases to pyrolyze, thereby depositing the superconducting thin film on said substrate;
   wherein said oxygen-containing gas is activated at a different portion from the reactor, thereafter said oxygen-containing gas is introduced into the reactor;
   wherein said organic metal gases and said oxygen-containing gas are alternately introduced into said reactor during the deposition of said thin film.

8. The method according to claim 7, wherein activation of said oxygen-containing gas is performed by exciting said oxygen-containing gas by means of a microwave discharge.

9. The method according to claim 8, wherein said oxygen-containing gas is excited at a portion which is located between said reactor and a supply source for said oxygen-containing gas.

10. The method according to claim 7, wherein said oxygen-containing gas is at least one selected from the group consisting of an O$_2$ gas, ozone, NO$_2$ gas, N$_2$O gas and water vapor.

11. The method according to claim 7, wherein said organic metal gas is carried by an inert gas.

12. The method according to claim 7, wherein said superconducting oxide thin film is YBa$_2$Cu$_3$O$_x$.

* * * * *